(12) United States Patent
Sethi et al.

(10) Patent No.: US 12,156,367 B2
(45) Date of Patent: Nov. 26, 2024

(54) DYNAMIC ASSIGNMENT OF STORAGE DEVICES RESPONSIVE TO MOVEMENT OF BLADE SERVERS AMONG SLOTS OF A CHASSIS OF A MODULAR SERVER

(71) Applicant: Dell Products L.P., Round Rock, TX (US)

(72) Inventors: Parminder Singh Sethi, Ludhiana (IN); Suren Kumar, Bangalore (IN); Veena Ramarao, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 115 days.

(21) Appl. No.: 18/133,064

(22) Filed: Apr. 11, 2023

(65) Prior Publication Data

US 2024/0349443 A1 Oct. 17, 2024

(51) Int. Cl.
| | |
|---|---|
| *G06F 9/00* | (2018.01) |
| *G06F 9/24* | (2006.01) |
| *G06F 9/4401* | (2018.01) |
| *G06F 15/177* | (2006.01) |
| *H05K 7/14* | (2006.01) |

(52) U.S. Cl.
CPC ......... *H05K 7/1498* (2013.01); *G06F 9/4411* (2013.01)

(58) Field of Classification Search
CPC ............................ G06F 9/4411; H05K 7/1498
See application file for complete search history.

(56) References Cited

U.S. PATENT DOCUMENTS

| | | | | |
|---|---|---|---|---|
| 8,386,838 B1* | 2/2013 | Byan | ................... | G06F 11/2046 714/6.23 |
| 8,880,687 B1* | 11/2014 | Chandrachari | ..... | H04L 41/0816 709/224 |
| 9,430,342 B1* | 8/2016 | Byan | ....................... | G06F 11/14 |
| 2012/0290878 A1* | 11/2012 | Gladwin | ............. | G06F 11/0793 714/48 |
| 2015/0143018 A1* | 5/2015 | Kim | .................... | G06F 13/4022 710/316 |

(Continued)

OTHER PUBLICATIONS

Dell Inc., "Dell SupportAssist Agent User's Guide," Rev. A00, Feb. 2015, 15 pages.

(Continued)

*Primary Examiner* — Mohammed H Rehman
(74) *Attorney, Agent, or Firm* — Ryan, Mason & Lewis, LLP

(57) ABSTRACT

An apparatus comprises a processing device configured to identify, for a modular server, blade servers installed in a first subset of slots of a chassis of the modular server and storage servers installed in a second subset of the slots. The processing device is also configured to determine, for the modular server, assignment of storage devices of the storage servers installed in the second subset of the slots to respective ones of the first subset of the slots in which the blade servers are installed. The processing device is further configured to detect movement of a given blade server from a first to a second slot in the first subset of the slots, and to dynamically reassign at least a subset of the storage devices from the first to the second slot responsive to validating a configuration of the given blade server moved from the first to the second slot.

20 Claims, 10 Drawing Sheets

(56) References Cited

U.S. PATENT DOCUMENTS

2020/0257642 A1* 8/2020 Anumalasetty ..... G06F 13/1668
2022/0308794 A1* 9/2022 Fukatani ............... G06F 3/0644

OTHER PUBLICATIONS

Dell Inc., "Dell SupportAssist for PCs and Tablets," Jan. 2015, 4 pages.
Dell EMC, "The Integrated Dell Remote Access Controller 9 (IDRAC9) with Lifecycle Controller," https://i.dell.com/sites/doccontent/shared-content/data-sheets/en/Documents/idrac-spec-sheet.pdf, Apr. 6, 2017, 6 pages.
Dell Technologies, "Dell EMC PowerEdge MX7000," Technical Guide, Rev. A09, Feb. 2023, 51 pages.
Dell EMC, "Integrated Dell Remote Access Controller 9 User's Guide," Rev. A02, Dec. 2020, 363 pages.
Dell EMC, "SupportAssist for Enterprise Systems," Rev. 1.1, Jan. 2016, 2 pages.

\* cited by examiner

DYNAMIC ASSIGNMENT OF STORAGE DEVICES RESPONSIVE TO MOVEMENT OF BLADE SERVERS AMONG SLOTS OF A CHASSIS OF A MODULAR SERVER

FIELD

The field relates generally to information processing, and more particularly to managing information processing systems.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

SUMMARY

Illustrative embodiments of the present disclosure provide techniques for dynamic assignment of storage devices responsive to movement of blade servers among slots of a chassis of a modular server.

In one embodiment, an apparatus comprises at least one processing device comprising a processor coupled to a memory. The at least one processing device is configured to identify, for a modular server comprising a chassis with a plurality of slots, one or more blade servers installed in a first subset of the plurality of slots of the chassis and one or more storage servers installed in a second subset of the plurality of slots of the chassis. The at least one processing device is also configured to determine, for the modular server, assignment of storage devices of the one or more storage servers installed in the second subset of the plurality of slots of the chassis to respective ones of the first subset of the plurality of slots of the chassis in which the one or more blade servers are installed. The at least one processing device is further configured to detect movement of a given one of the one or more blade servers from a first slot to a second slot in the first subset of the plurality of slots, to validate a configuration of the given blade server moved from the first slot to the second slot, and to dynamically reassign at least a subset of the storage devices from the first slot to the second slot responsive to validating the configuration of the given blade server moved from the first slot to the second slot.

These and other illustrative embodiments include, without limitation, methods, apparatus, networks, systems and processor-readable storage media.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Information technology (IT) assets, also referred to herein as IT equipment, may include various compute, network and storage hardware or other electronic equipment, and are typically installed in an electronic equipment chassis. The electronic equipment chassis may form part of an equipment cabinet (e.g., a computer cabinet) or equipment rack (e.g., a computer or server rack, also referred to herein simply as a "rack") that is installed in a data center, computer room or other facility. Equipment cabinets or racks provide or have physical electronic equipment chassis that can house multiple pieces of equipment, such as multiple computing devices (e.g., blade or compute servers, storage arrays or other types of storage servers, storage systems, network devices, etc.). As noted above, an electronic equipment chassis typically complies with established standards of height, width and depth to facilitate mounting of electronic equipment in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

Figure 1:
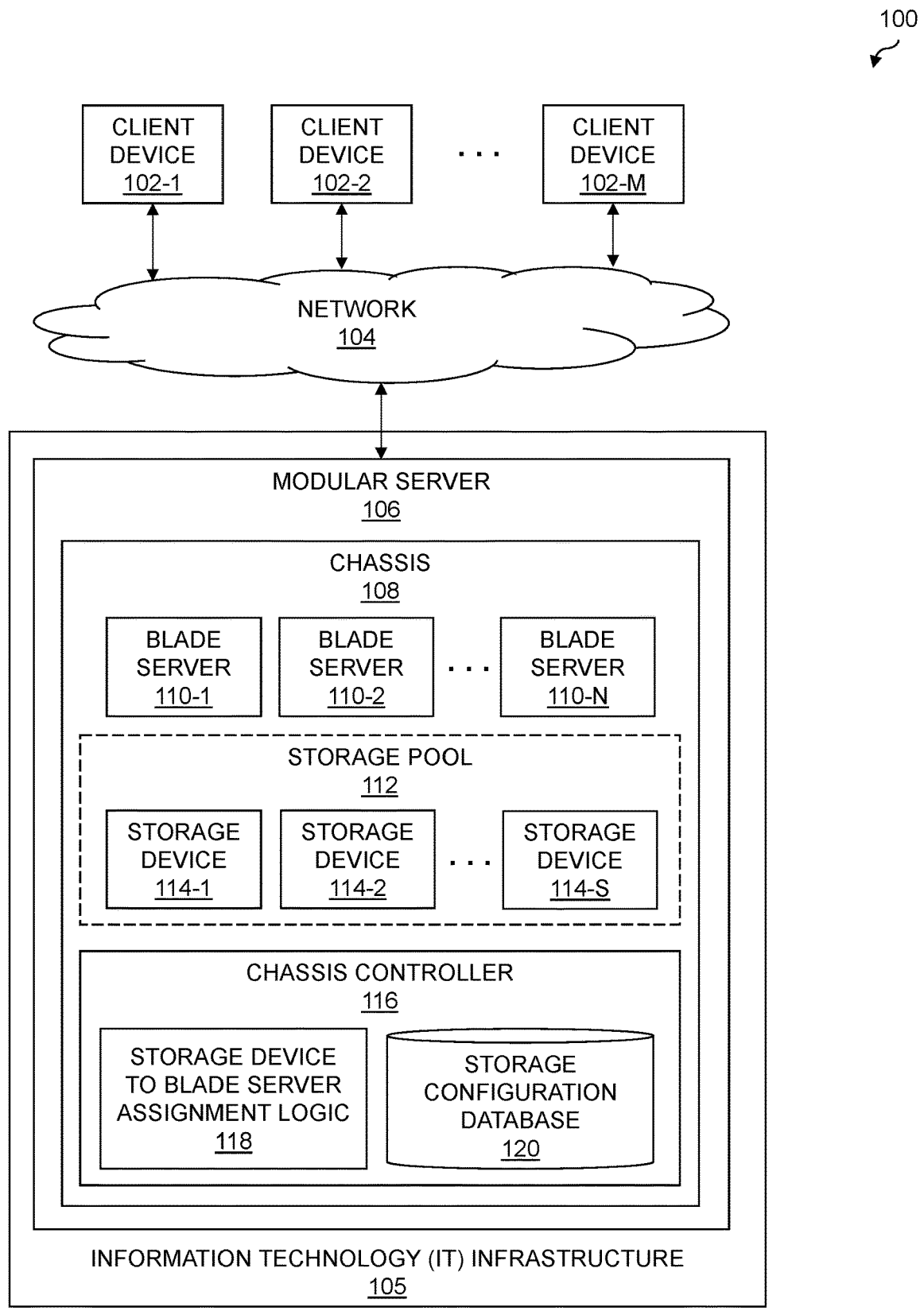
FIG. 1 is a block diagram of an information processing system configured for dynamic assignment of storage devices responsive to movement of blade servers among slots of a chassis of a modular server in an illustrative embodiment.

FIG. 1 shows an information processing system 100 configured in accordance with an illustrative embodiment. The information processing system 100 is assumed to be built on at least one processing platform and provides functionality for dynamically mapping storage devices to blade servers after internal movement within a chassis of a modular server. The information processing system 100 includes a set of client devices 102-1, 102-2, . . . 102-M (collectively, client devices 102) which are coupled to a network 104. Also coupled to the network 104 is an IT infrastructure 105 comprising one or more IT assets including at least one modular server 106. The IT assets of the IT infrastructure 105 may comprise physical and/or virtual computing resources. Physical computing resources may include physical hardware such as servers, storage systems, networking equipment, Internet of Things (IoT) devices, other types of processing and computing devices including desktops, laptops, tablets, smartphones, etc. Virtual computing resources may include virtual machines (VMs), containers, etc.

The modular server 106 includes a chassis 108 in which a set of blade servers 110-1, 110-2, . . . 110-N (collectively, blade servers 110) and a storage pool 112 comprising a set of storage devices 114-1, 114-2, . . . 114-S (collectively, storage devices 114) are installed. The chassis 108 also includes a chassis controller 116 implementing storage device to blade server assignment logic 118 and a storage configuration database 120.

In some embodiments, the modular server 106 is used for an enterprise system. For example, an enterprise may have various IT assets, including the modular server 106, which it operates in the IT infrastructure 105 (e.g., for running one or more software applications or other workloads of the enterprise) and which may be accessed by users of the enterprise system via the client devices 102. As used herein, the term "enterprise system" is intended to be construed broadly to include any group of systems or other computing devices. For example, the IT assets of the IT infrastructure 105 may provide a portion of one or more enterprise systems. A given enterprise system may also or alternatively include one or more of the client devices 102. In some embodiments, an enterprise system includes one or more data centers, cloud infrastructure comprising one or more clouds, etc. A given enterprise system, such as cloud infrastructure, may host assets that are associated with multiple enterprises (e.g., two or more different businesses, organizations or other entities).

The client devices 102 may comprise, for example, physical computing devices such as IoT devices, mobile telephones, laptop computers, tablet computers, desktop computers or other types of devices utilized by members of an enterprise, in any combination. Such devices are examples of what are more generally referred to herein as "processing devices." Some of these processing devices are also generally referred to herein as "computers." The client devices 102 may also or alternately comprise virtualized computing resources, such as VMs, containers, etc.

The client devices 102 in some embodiments comprise respective computers associated with a particular company, organization or other enterprise. Thus, the client devices 102 may be considered examples of assets of an enterprise system. In addition, at least portions of the information processing system 100 may also be referred to herein as collectively comprising one or more "enterprises." Numerous other operating scenarios involving a wide variety of different types and arrangements of processing nodes are possible, as will be appreciated by those skilled in the art.

The network 104 is assumed to comprise a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks.

Although not explicitly shown in FIG. 1, one or more input-output devices such as keyboards, displays or other types of input-output devices may be used to support one or more user interfaces to the modular server 106, as well as to support communication between the modular server 106 and other related systems and devices not explicitly shown.

In some embodiments, the client devices 102 are assumed to be associated with system administrators, IT managers or other authorized personnel responsible for managing the IT assets of the IT infrastructure 105, including the modular server 106. For example, a given one of the client devices 102 may be operated by a user to access a graphical user interface (GUI) provided by the chassis controller 116 to manage one or more of the blade servers 110 and/or one or more of the storage devices 114 of the storage pool 112. In some embodiments, functionality of the chassis controller 116 (e.g., the storage device to blade server assignment logic 118) may be implemented outside the chassis controller 116 (e.g., on one or more other ones of the IT assets of the IT infrastructure 105, on one or more of the client devices 102, an external server or cloud-based system, etc.).

In some embodiments, the client devices 102, the blade servers 110 and/or the storage pool 112 may implement host agents that are configured for automated transmission of information regarding the modular server 106 (e.g., the current storage configuration or mapping between different ones of the storage devices 114 and particular ones of the slots of the chassis 108 in which different ones of the blade servers 110 are installed. It should be noted that a "host agent" as this term is generally used herein may comprise an automated entity, such as a software entity running on a processing device. Accordingly, a host agent need not be a human entity.

The chassis controller 116 in the FIG. 1 embodiment is assumed to be implemented using at least one processing device. Each such processing device generally comprises at least one processor and an associated memory, and implements one or more functional modules or logic for controlling certain features of the modular server 106. In the FIG. 1 embodiment, the chassis controller 116 implements the storage device to blade server assignment logic 118. The storage device to blade server assignment logic 118 is configured to determine mappings between the storage devices 114 of the storage pool 112 and particular ones of the slots of the chassis 108 in which different ones of the blade servers 110 are installed. Such mappings, or blade server to storage device assignment storage configurations, are maintained in the storage configuration database 120. In some embodiments, one or more of the storage systems utilized to implement the storage configuration database 120 comprise a scale-out all-flash content addressable storage array or other type of storage array.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems in illustrative embodiments include all-flash and hybrid flash storage arrays, software-defined storage products, cloud storage products, object-based storage products, and scale-out NAS clusters. Combinations of multiple ones of these and other storage products can also be used in implementing a given storage system in an illustrative embodiment.

The storage device to blade server assignment logic 118 is further configured to track movement of the blade servers 110 among different slots of the chassis 108 of the modular server 106. On detecting that a given one of the blade servers 110 (e.g., blade server 110-1) has moved from a first slot to a second slot, the storage device to blade server assignment logic 118 is configured to validate that a configuration of the given blade server 110-1 has not changed (e.g., that the hardware configuration is the same, that no malicious software has been installed thereon, etc.). On validating that the given blade server 110-1 has not changed (or, on an authorized user authenticating a new configuration of the given blade server 110-1), the storage device to blade server assignment logic 118 is configured to re-map or re-assign the storage devices from the first slot to the second slot.

It is to be appreciated that the particular arrangement of the client devices 102, the IT infrastructure 105 and the modular server 106 illustrated in the FIG. 1 embodiment is presented by way of example only, and alternative arrangements can be used in other embodiments. As discussed above, for example, the modular server 106 (or portions of components thereof, such as one or more of the storage device to blade server assignment logic 118 and the storage configuration database 120) may in some embodiments be implemented internal to one or more of the client devices 102 and/or other IT assets of the IT infrastructure 105.

At least portions of the storage device to blade server assignment logic 118 may be implemented at least in part in the form of software that is stored in memory and executed by a processor.

The modular server 106 and other portions of the information processing system 100, as will be described in further detail below, may be part of cloud infrastructure.

The modular server 106 and other components of the information processing system 100 in the FIG. 1 embodiment are assumed to be implemented using at least one processing platform comprising one or more processing devices each having a processor coupled to a memory. Such processing devices can illustratively include particular arrangements of compute, storage and network resources.

The client devices 102, IT infrastructure 105, the modular server 106 or components thereof (e.g., the blade servers 110, the storage pool 112, the chassis controller 116, the storage device to blade server assignment logic 118 and the storage configuration database 120) may be implemented on respective distinct processing platforms, although numerous other arrangements are possible. For example, in some embodiments at least portions of the modular server 106 and one or more of the client devices 102 are implemented on the same processing platform. A given client device (e.g., 102-1) can therefore be implemented at least in part within at least one processing platform that implements at least a portion of the modular server 106.

The term "processing platform" as used herein is intended to be broadly construed so as to encompass, by way of illustration and without limitation, multiple sets of processing devices and associated storage systems that are configured to communicate over one or more networks. For example, distributed implementations of the information processing system 100 are possible, in which certain components of the system reside in one data center in a first geographic location while other components of the system reside in one or more other data centers in one or more other geographic locations that are potentially remote from the first geographic location. Thus, it is possible in some implementations of the information processing system 100 for the client devices 102, the IT infrastructure 105, and the modular server 106, or portions or components thereof, to reside in different data centers. Numerous other distributed implementations are possible.

Additional examples of processing platforms utilized to implement the information processing system 100 in illustrative embodiments will be described in more detail below in conjunction with FIGS. 9 and 10.

It is to be appreciated that these and other features of illustrative embodiments are presented by way of example only, and should not be construed as limiting in any way.

It is to be understood that the particular set of elements shown in FIG. 1 for dynamic assignment of the storage devices 114 responsive to movement of the blade servers 110 among slots of the chassis 108 of the modular server 106 is presented by way of illustrative example only, and in other embodiments additional or alternative elements may be used. Thus, another embodiment may include additional or alternative systems, devices and other network entities, as well as different arrangements of modules and other components.

It is to be appreciated that these and other features of illustrative embodiments are presented by way of example only, and should not be construed as limiting in any way.

Figure 2:
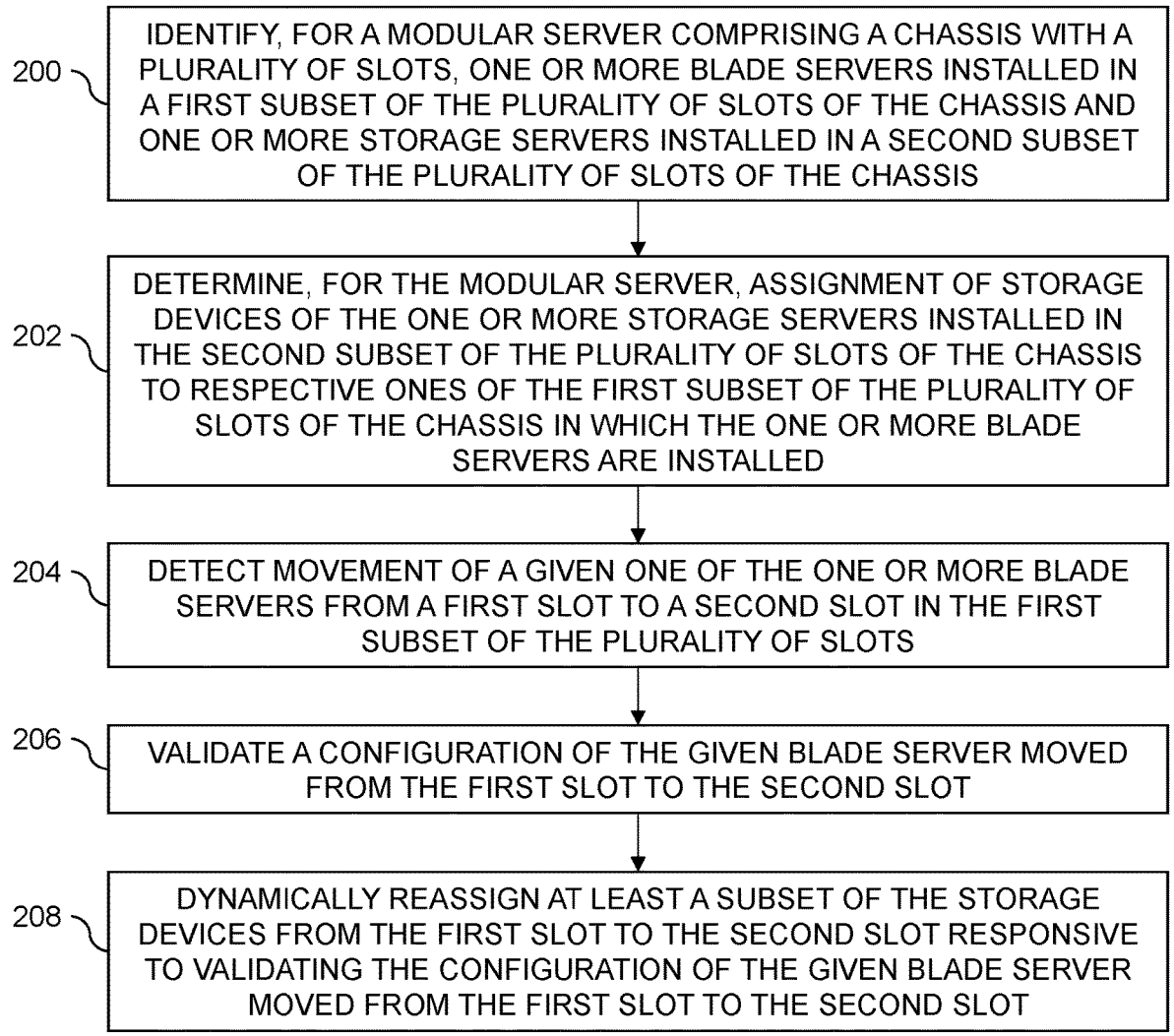
FIG. 2 is a flow diagram of an exemplary process for dynamic assignment of storage devices responsive to movement of blade servers among slots of a chassis of a modular server in an illustrative embodiment.

An exemplary process for dynamic assignment of storage devices responsive to movement of blade servers among slots of a chassis of a modular server will now be described in more detail with reference to the flow diagram of FIG. 2. It is to be understood that this particular process is only an example, and that additional or alternative processes for dynamic assignment of storage devices responsive to movement of blade servers among slots of a chassis of a modular server may be used in other embodiments.

In this embodiment, the process includes steps 200 through 208. These steps are assumed to be performed by the chassis controller 116 of the chassis 108 of the modular server 106 utilizing the storage device to blade server assignment logic 118 and the storage configuration database 120. The process begins with step 200, identifying, for the modular server 106 comprising the chassis 108 with a plurality of slots, the blade servers 110 installed in a first subset of the plurality of slots of the chassis and one or more storage servers (e.g., the storage pool 112) installed in a second subset of the plurality of slots of the chassis. Step 200 may comprise determining a hardware configuration of each of the blade servers 110 installed in the first subset of the plurality of slots. The determined hardware configuration for a given one of the blade servers (e.g., blade server 110-1) may be maintained in a trusted platform module (TPM).

In step 202, assignment of the storage devices (e.g., storage devices 114) of the one or more storage servers installed in the second subset of the plurality of slots of the chassis 108 to respective ones of the first subset of the plurality of slots of the chassis 108 in which the blade servers 110 are installed is determined. Movement of the given blade server 110-1 from a first slot to a second slot in the first subset of the plurality of slots is detected in step 204. In step 206, a configuration of the given blade server moved from the first slot to the second slot is validated. At least a subset of the storage devices 114 are dynamically reassigned from the first slot to the second slot in step 208 responsive to validating the configuration of the given blade server 110-1 moved from the first slot to the second slot.

Step 202 may comprise generating a logical storage tree of mappings between the storage devices 114 of the one or more storage servers and the first subset of the plurality of slots of the chassis. The logical storage tree may comprise a logical abstraction of physical storage assignment of the storage devices 114 of the one or more storage servers to the blade servers 110. The logical storage tree may comprise one or more controller groups and one or more storage device groups. The logical storage tree may also or alternatively comprise information for each of the one or more blade servers 110, the information for the given blade server 110-1 comprising an identifier of the given blade server 110-1, a given slot number of the chassis in which the given blade server 110-1 is installed, and an inventory of the storage devices 114 assigned to the given slot number of the chassis 108. Step 208 may comprise identifying a storage configuration of the given blade server 110-1 based at least in part on mapping an identifier of the given blade server 110-1 to the logical storage tree.

Step 206 may comprise at least one of detecting tampering of the given blade server 110-1 and determining whether any malicious software is detected on the given blade server 110-1 moved from the first slot to the second slot. Step 206 may also or alternatively comprise comparing a hardware inventory of the given blade server 110-1 before and after movement of the given blade server 110-1 from the first slot to the second slot. The hardware inventory of the given blade server 110-1 before movement of the given blade server 110-1 from the first slot to the second slot is maintained in a TPM, and the hardware inventory of the given blade server 110-1 after movement of the given blade server 110-1 from the first slot to the second slot may be determined utilizing one or more physical security algorithms of the TPM. Responsive to determining that a first hardware inventory of the given blade server 110-1 before movement of the given blade server 110-1 from the first slot to the second slot does not match a second hardware inventory of the given blade server 110-1 after movement of the given blade server 110-1 from the first slot to the second slot, the configuration of the given blade server 110-1 is validated by a user proving a TPM security key of the TPM.

Due to the hardware feasibility of accommodating a large number of hard disk drives (HDDs) or other storage devices, as well as the availability of centralized storage management functionality for multiple servers, various end-users utilize a "modular" server architecture and "blade" servers for applications which require a large amount of storage space. A modular server may include an enclosure or chassis, one or more blade servers, and one or more storage servers providing a storage pool that is utilized by the one or more blade servers. The chassis includes multiple slots in which the blade servers and storage servers may be installed. The chassis also includes management software (e.g., which may run as part of a chassis controller or chassis management console) providing various functionality for managing the blade servers and storage servers which are installed in the chassis. The chassis may also include one or more power supplies for powering the blade servers and storage servers installed in the chassis, cooling equipment (e.g., one or more fans) for cooling the blade servers and storage servers installed in the chassis, networking equipment (e.g., one or more network interface controllers, host adapters, etc.) which may be utilized by the blade servers and storage servers installed in the chassis, etc. In a modular server, the installed blade servers are physical servers configured to work independently, while the storage servers providing the storage pool may comprise a set of storage devices arranged in a Just a Bunch of Drives (JBOD) configuration.

Figure 3:
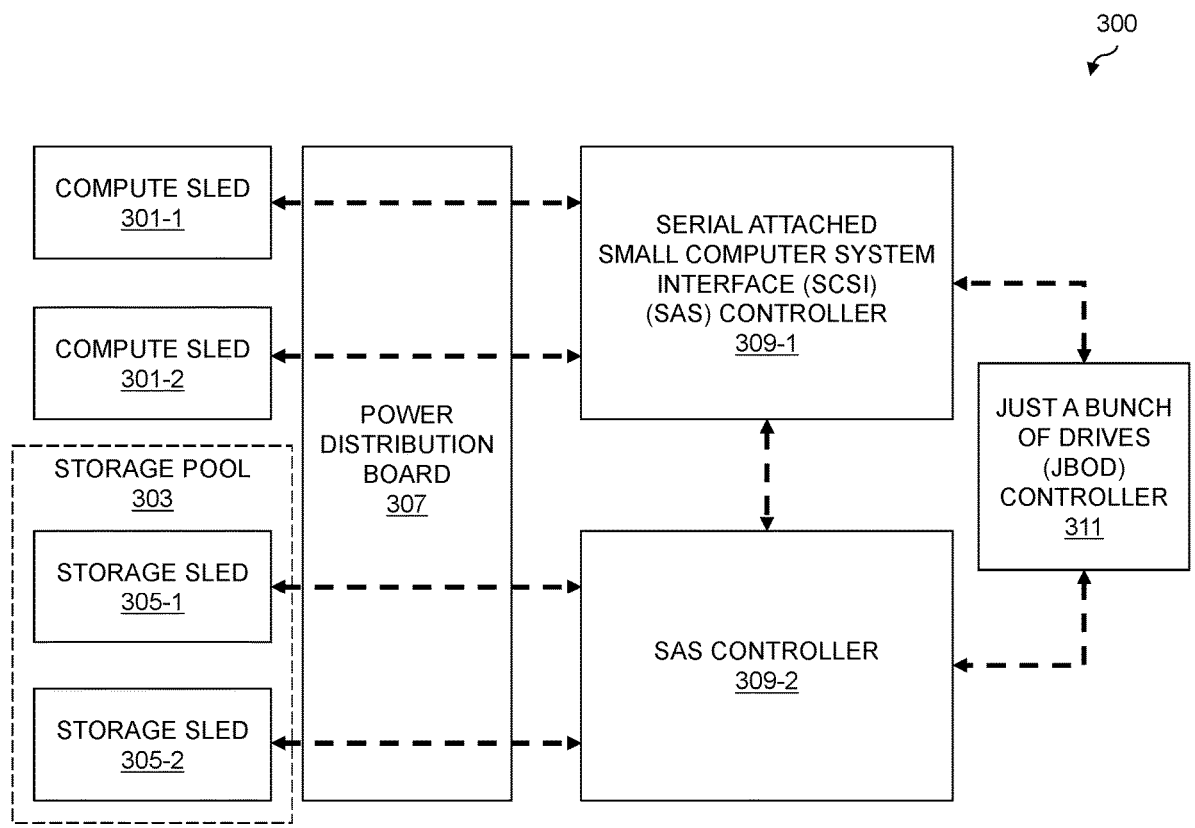
FIG. 3 shows a storage architecture of a modular server in an illustrative embodiment.

FIG. 3 shows a storage architecture 300 of a modular server, which includes compute sleds 301-1 and 301-2 (collectively, compute sleds 301), a storage pool 303 including storage sleds 305-1 and 305-2 (collectively, storage sleds 305), a power distribution board (PDB) 307, serial attached Small Computer System Interface (SCSI) (SAS) controllers 309-1 and 309-2 (collectively, SAS controllers 309), and a JBOD controller 311. The compute sleds 301-1 and 301-2 are each connected to each of the SAS controller 309-1 and 309-2, via the PDB 307. Similarly, the storage sleds 305-1 and 305-2 are each connected to each of the SAS controllers 309-1 and 309-2, via the PDB 307. The SAS controllers 309-1 and 309-2 are connected to one another, as well as the JBOD controller 311. The SAS controllers 309 enable users to assign HDDs or other storage devices (e.g., of storage servers installed in the storage sleds 305 providing the storage pool 303) to different blade servers (e.g., installed in the computed sleds 301). Storage devices will be accessible only to the respective blade servers to which they are assigned. The storage devices will be accessed only by the particular blade servers assigned thereto through an internal storage controller (e.g., a Dell PowerEdge Redundant Array of Independent Disks (RAID) Controller (PERC) which is part of a corresponding one of the compute sleds 301).

Figure 4:
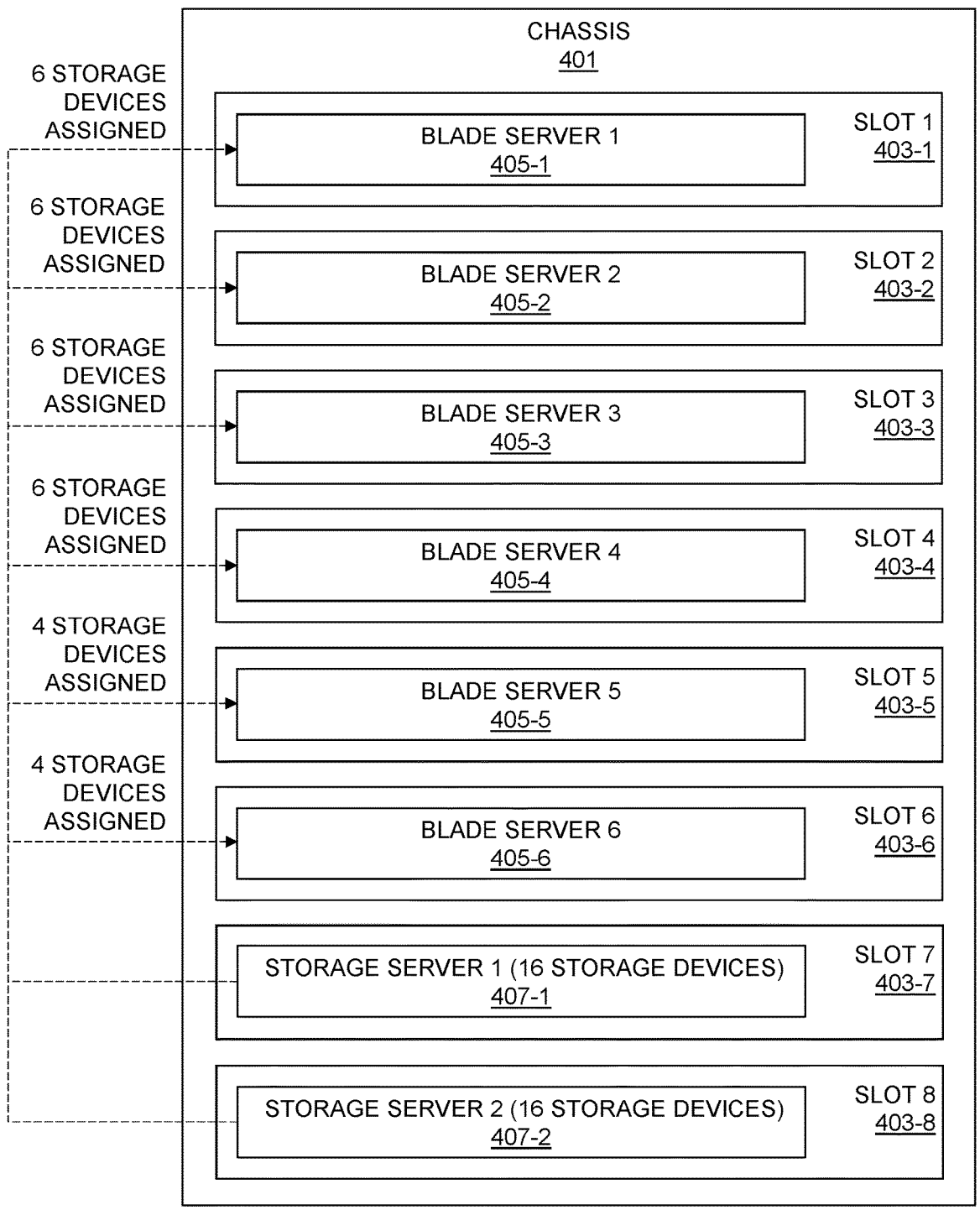
FIG. 4 shows a chassis of a modular server with multiple slots in which blade and storage servers are installed in an illustrative embodiment.

FIG. 4 shows an example of a modular server architecture 400, including a chassis 401 with a set of eight slots 403-1 through 403-8 (collectively, slots 403). A set of six blade servers 405-1 through 405-6 (collectively, blade servers 405) are installed in the slots 403-1 through 403-6 of the chassis 401, and two storage servers 407-1 and 407-2 (collectively, storage servers 407) are installed in the slots 403-7 and 403-8, respectively. The storage servers 407 may comprise Dell Insight storage pools (e.g., JBOD or other storage pools). In the FIG. 4 example, each of the storage servers 407 accommodates up to 16 HDDs or other storage devices, which are assigned to different ones of the blade servers 405 as illustrated (e.g., with six storage devices being assigned to each of the blade servers 405-1 through 405-4, and with four storage devices being assigned to the blade server 405-5 and the blade server 405-6). It should be appreciated, however, that the particular numbers of slots, blade servers, storage servers, storage devices, and the assignment of storage devices to blade servers shown in FIG. 4 is presented by way of non-limiting example only.

In the modular server architecture 400, the storage devices of the storage servers 407 are assigned to particular ones of the slots 403 of the chassis 401. If a given one of the blade servers 405 were to be moved to a different one of the slots 403 in the chassis 401, the assigned storage device configuration will not work. By way of example, assume that the blade server 405-1 is moved from slot 403-1 to slot 403-5 (and that the blade server 405-5 is either removed, or moved to another of the slots 403 such as the slot 403-1 freed up by movement of the blade server 405-1). The storage devices which are configured for the blade server 405-1 will not be mapped automatically (e.g., from slot 403-1 to slot 403-5). In this case, an IT administrator or other authorized user, before swapping the blade server 405-1 from slot 403-1 to slot 403-5, must un-assign the storage devices from the slot 403-1 (e.g., where the blade 405-1 is currently located). Once the blade server 405-1 is swapped to slot 403-5, the IT administrator or other authorized use will have to manually re-assign the storage devices to the slot 403-5 (e.g., where the blade server 405-1 is moved to) by tracing the previous configuration. Any incorrect mappings of the storage device assignment leads to storage device configuration collision, which can potentially result in data loss. The technical solutions described herein provide functionality for intelligently reconfiguring storage devices in the case of movement of the blade servers 405 among the slots 403 of the chassis 401. Blade servers 405 may need to be moved between different ones of the slots 403 of the chassis 401 for various reasons, including but not limited to situations in which there are hardware issues with one or more of the slots 403, during maintenance operations, during reconfiguration or reuse of the blade servers 405 for different projects, etc.

The technical solutions described herein provide end-to-end intelligence in chassis management tools for identifying, validating and securely reassigning (e.g., proactively) storage device configurations after server movement between slots in a chassis. Currently, HDD or other storage device configurations in a modular chassis are mapped to particular blade server slots. With the technical solutions described herein, when a blade server is moved from one slot to another in a chassis, the storage device configuration is re-assigned seamlessly.

Figure 5:
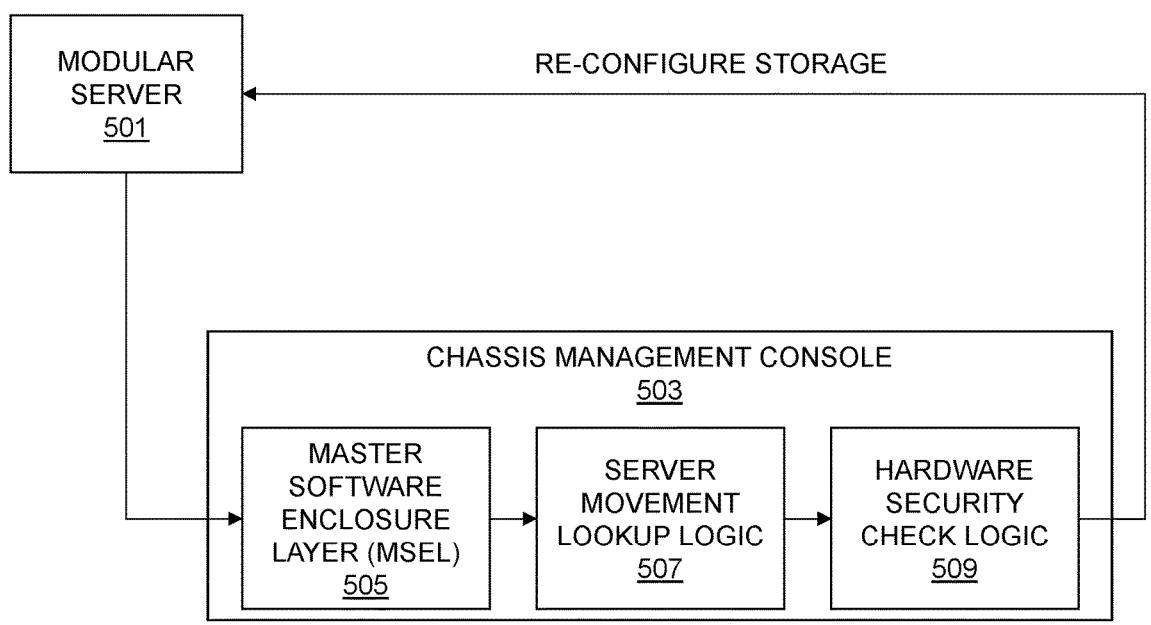
FIG. 5 shows an architecture of a chassis management console configured for dynamically mapping storage devices to blade servers after internal movement within a chassis of a modular server in an illustrative embodiment.

FIG. 5 shows an architecture 500 including a modular server 501 associated with a chassis management console 503. The chassis management console 503 may be implemented using a processing platform of the modular server 501, or on a processing platform external to the modular server 501. The chassis management console 503 implements a master software enclosure layer (MSEL) 505, server movement lookup logic 507, and hardware security check logic 509. The MSEL 505 abstracts the physical HDD or other storage device assignment of the modular server 501 and forms a soft layer storage tree. The server movement lookup logic 507 collects the hardware inventory (e.g., of all blade and storage servers installed in the modular server 501) along with identifiers for the hardware (e.g., service tags). The server movement lookup logic 507 maps the storage configuration for each of the blade servers installed in the modular server 501 and stores it in the database. This data is used when reassigning or reconfiguring storage configurations when blade servers move (e.g., between different slots of the modular server 501). The hardware security check logic 509 is configured to utilize Trusted Platform Module (TPM) hardware encryption to ensure that the original hardware (e.g., of a blade server) is installed back (e.g., in a different slot) with no hardware tampering. This helps to authenticate and authorize server movement before reassigning the storage configuration. TPMs use multiple physical security mechanisms to ensure that re-inserted blade servers are tamper-resistant and that no malicious software is detected. The chassis management console 503 may utilize passthrough channels (e.g., Dell SupportAssist, Integrated Dell Remote Access Controller (iDRAC), Universal Serial Bus (USB), Network Interface Card (NIC), etc.) to get the storage configuration details for the blade servers installed in the modular server 501. Various other passthrough channels may be used.

Figure 6:
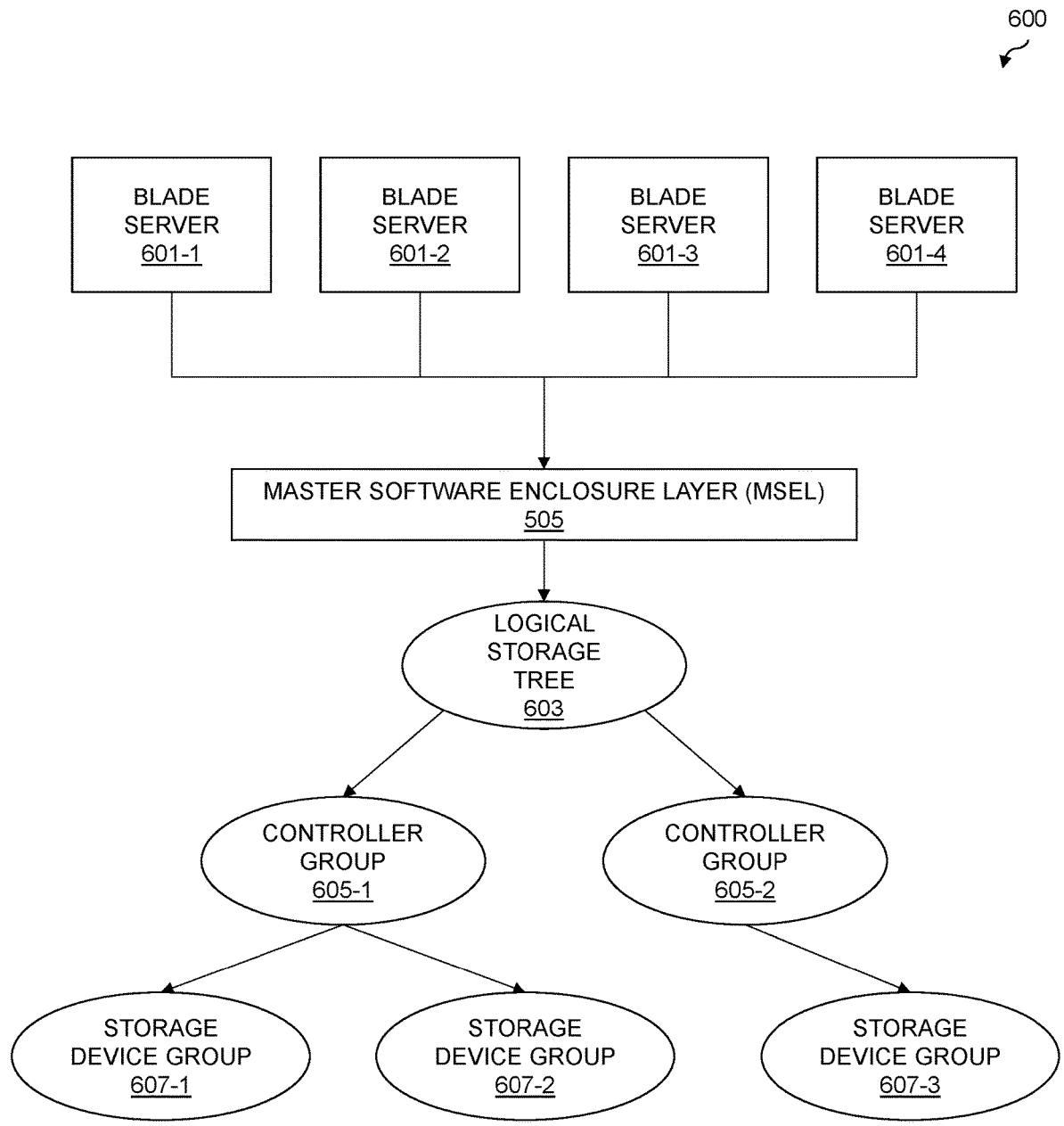
FIG. 6 shows a system illustrating generation of a logical storage tree of mappings between storage devices and blade servers of a modular server in an illustrative embodiment.

FIG. 6 shows a system 600 illustrating functionality of the MSEL 505. The system 600 includes a set of blade servers 601-1, 601-2, 601-3 and 601-4 (collectively, blade servers 601) and the MSEL 505 which is configured to abstract the storage configurations of the blade servers 601 (e.g., which are installed in a modular chassis of a modular server) to create a logical storage tree 603. The modular chassis in which the blade servers 601 are installed will have access to the storage configuration details of the blade servers 601, and this data will be used by the MSEL 505 to create the logical abstraction (e.g., the logical storage tree 603) of the physical storage assignment. The MSEL 505 may be implemented in the chassis of the modular server 501 to perform the logical storage tree 603 abstraction, and may be stored on external storage space of the chassis management controller or chassis management console 503. The MSEL 505 implements functionality for data generalization, formation of the logical storage tree 603, and synchronization of the logical storage tree 603. The data generalization functionality includes performing data filtering, duplication removal, and structing. The fine-tuned data produced using the data generalization functionality will be used and transferred for formation and synchronization processes for the logical storage tree 603. The MSEL 505 is configured to create the logical storage tree 603, and for grouping components in the logical storage tree 603. FIG. 6, for example, shows the logical storage tree 603 including controller groups 605-1 and 605-2 (collectively, controller groups 605) and storage device groups 607-1, 607-2 and 607-3 (collectively, storage device groups 607). The MSEL 505 is also configured to synchronize the logical storage tree 603 to keep the logical layer (e.g., of the logical storage tree 603) up to date. In other words, whenever there are any changes in the storage configuration, the MSEL 505 performs the required synchronization to keep the logical storage tree 603 up to date.

Figure 7:
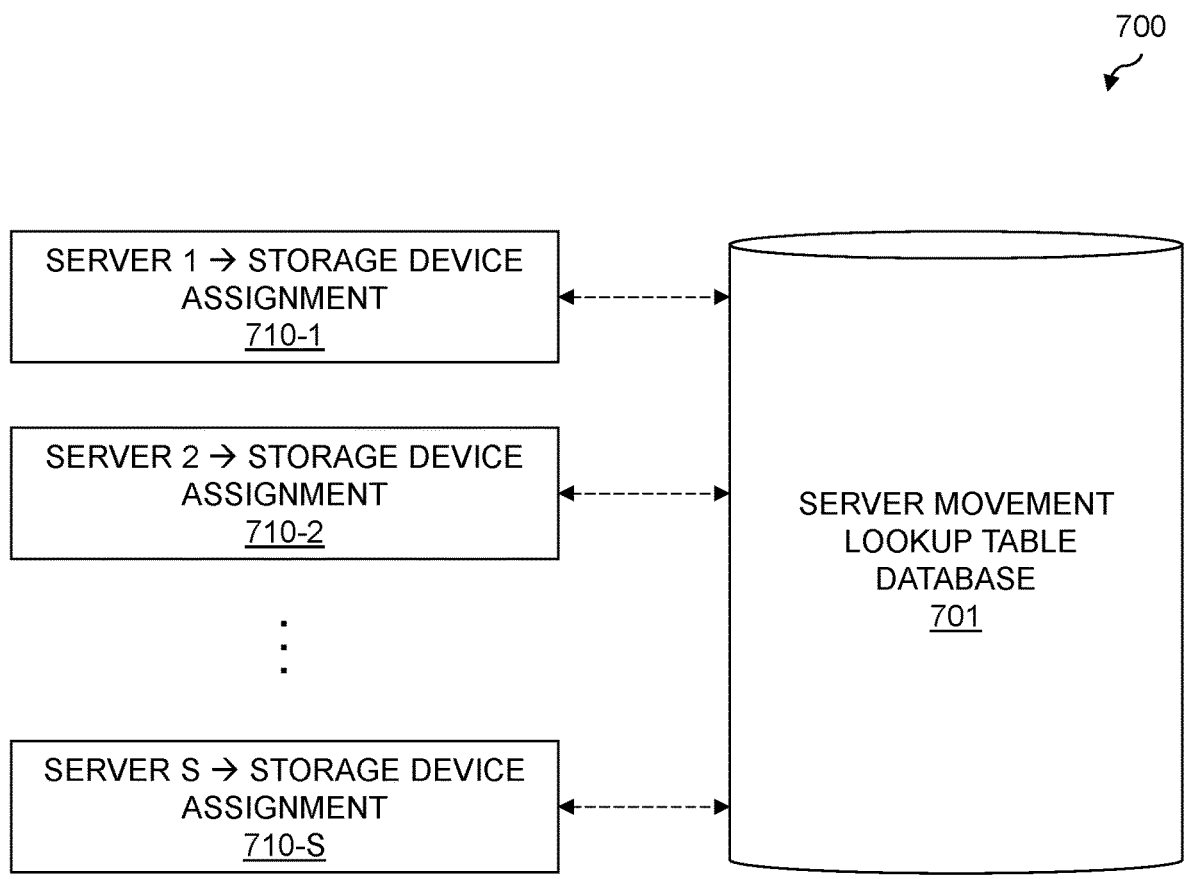
FIG. 7 shows a system illustrating a server movement lookup table database in an illustrative embodiment.

FIG. 7 shows a system 700 illustrating functionality of the server movement lookup logic 507. The system 700 includes a server movement lookup table database 701, which maintains storage assignments 710-1, 710-2 and 710-S (collectively server-to-storage device assignments 710) between blade servers and storage devices in a modular server. The server movement lookup logic 507 provides a rules engine which will detect blade server movement in the chassis of the modular server 501, and performs reassignment of the storage configuration. The chassis logs and inventory will be used for detecting server movement within the modular server 501. The logical storage tree 603 of all the blade servers 601 installed in the modular server 501 will be stored in the chassis, along with identifiers (e.g., service tags), slot numbers, and other inventory details. When server movement in the chassis is detected, the server movement lookup logic 507 initiates a job to look for the storage configuration (e.g., of one or more of the blade servers 601 which have been moved) in the server movement lookup table database 701. The storage configuration is identified using the identifiers (e.g., service tags) of the moved blade servers 601. If a storage configuration is available, an authorization job or process is initiated utilizing the hardware security check logic 509. If no storage configuration is available, appropriate logs are reported and the job or process ends.

Figure 8:
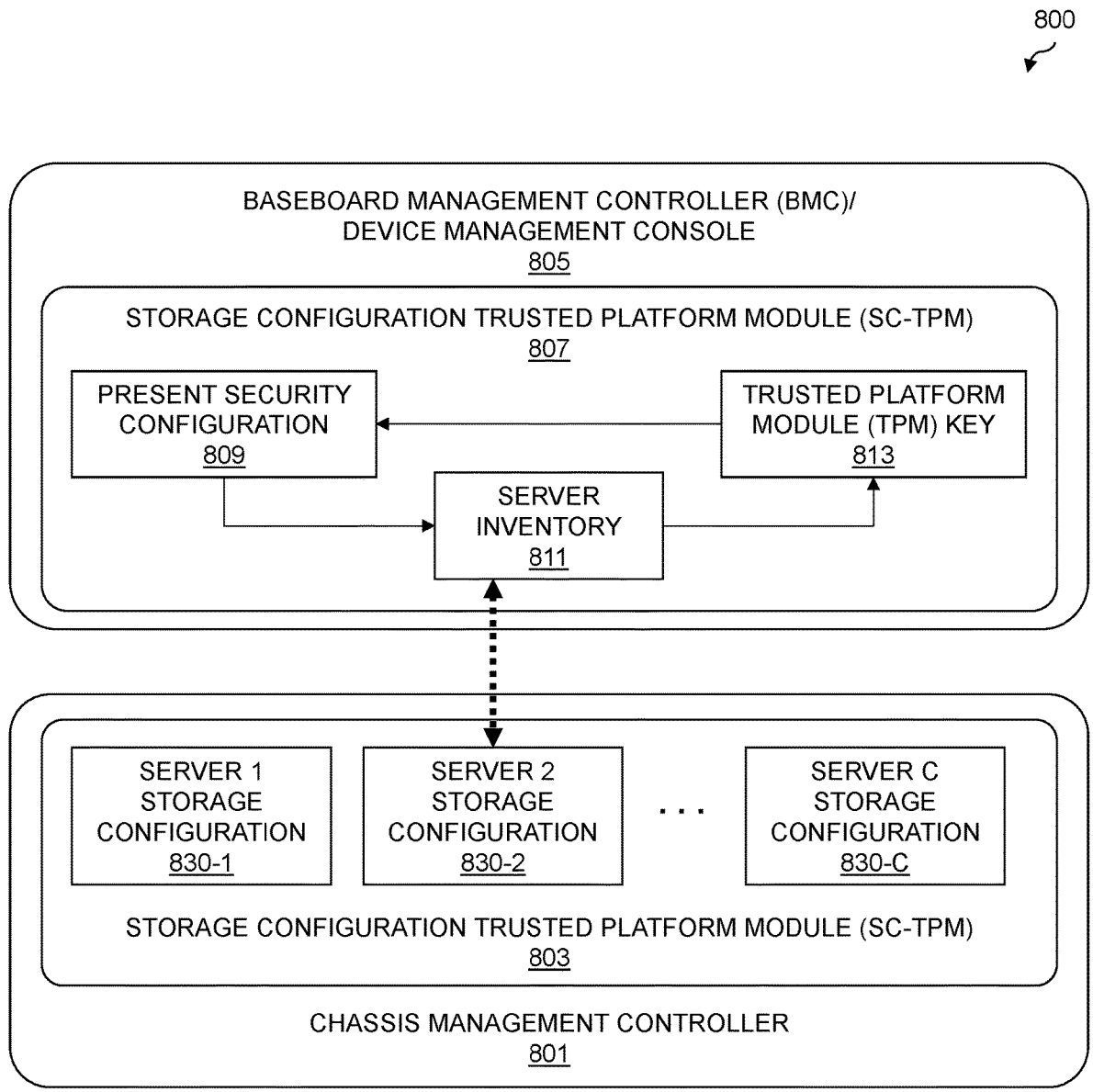
FIG. 8 shows a system illustrating storage configuration trusted platform modules configured for validating hardware configurations of blade servers moved within a chassis of a modular server in an illustrative embodiment.

FIG. 8 shows a system 800 illustrating functionality of the hardware security check logic 509. As noted above, in some embodiments the hardware security check logic 509 uses TPM hardware encryption to ensure that the original hardware of the blade servers 601 being moved are installed back, and that there is no hardware tampering performed on the blade servers 601 being moved. The hardware security check logic 509 is configured to authenticate and authorize the server movement before reassigning the storage configuration. The TPM uses multiple physical security mechanisms to ensure that the reinserted blade servers are tamper resistant and that no malicious software is detected. The system 800 includes a chassis management controller (CMC) 801 implementing a storage configuration TPM (SC-TPM) 803 which securely maintains server storage configurations 830-1, 830-2, . . . 830-C (collectively, server storage configurations 830) for different ones of the blade servers 601 installed in the modular server 501. A baseboard management controller (BMC)/device management console 805 running on a given one of the blade servers 601 similarly implements a SC-TPM 807. The SC-TPMs 803 and 807 implemented on the CMC 801 and the BMC 805, respectively, are configured to compare the hardware inventory of the given blade server 601 on which the BMC 805 runs before and after movement of the given blade server 601. To do so, the SC-TPM 807 determines a present security configuration 809 of the given blade server 601, and compares this against a stored server inventory 811 maintained on the SC-TPM 807. If the inventories match, the SC-TPM 807 will authorize the hardware movement, and obtain from the SC-TPM 803 one of the server storage configurations 830 (e.g., server 2 storage configuration 830-2) associated with the given blade server 601, which will be assigned to the given blade server 601 after movement thereof. If the inventories do not match, a user will need to authenticate the movement of the given blade server 601 by proving the TPM security key 813 of the SC-TPM 807. Until the SC-TPM 807 security is successful, the storage configuration will not be assigned.

The technical solutions described herein provide functionality for creating a MSEL which abstracts the storage configurations of blade servers which are installed in a chassis of a modular server, and which create a logical storage tree for such storage configurations. The technical solutions described herein also detect movement of blade and storage servers in the chassis of the modular server (e.g., by tapping into SupportAssist or other configuration reports) and by co-relating service tags or other identifier mapping of the host with the blade and storage servers. The technical solutions described herein further dynamically detect and reassign HDDs or other storage devices to blade servers after movement thereof internal to the chassis of the modular server (e.g., through comparing previous assignments and the configurations of the blade servers before and after movement thereof).

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for dynamic assignment of storage devices responsive to movement of blade servers among slots of a chassis of a modular server will now be described in greater detail with reference to FIGS. 9 and 10. Although described in the context of system 100, these platforms may also be used to implement at least portions of other information processing systems in other embodiments.

Figure 9:
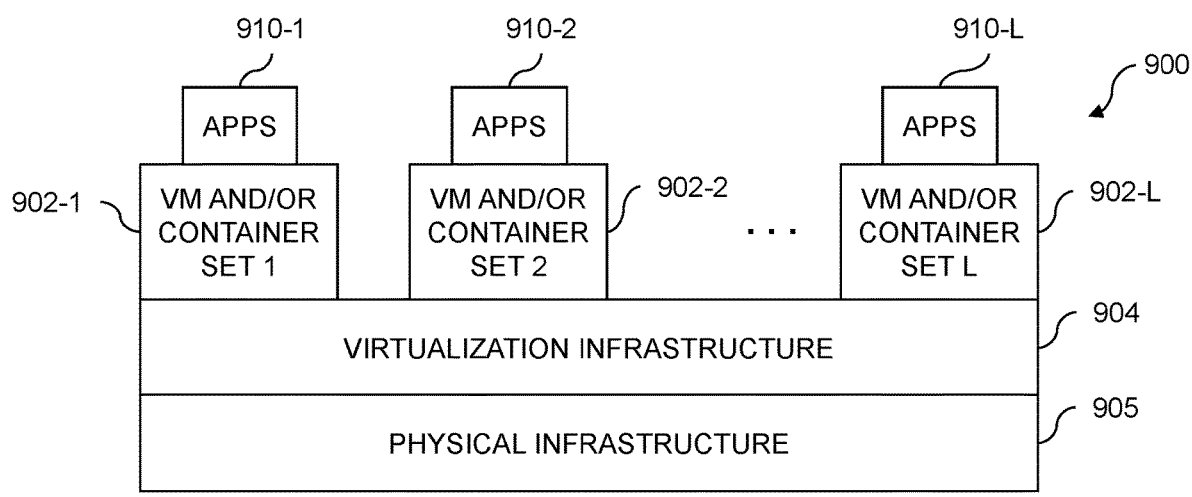
FIGS. 9 and 10 show examples of processing platforms that may be utilized to implement at least a portion of an information processing system in illustrative embodiments.
Figure 10:
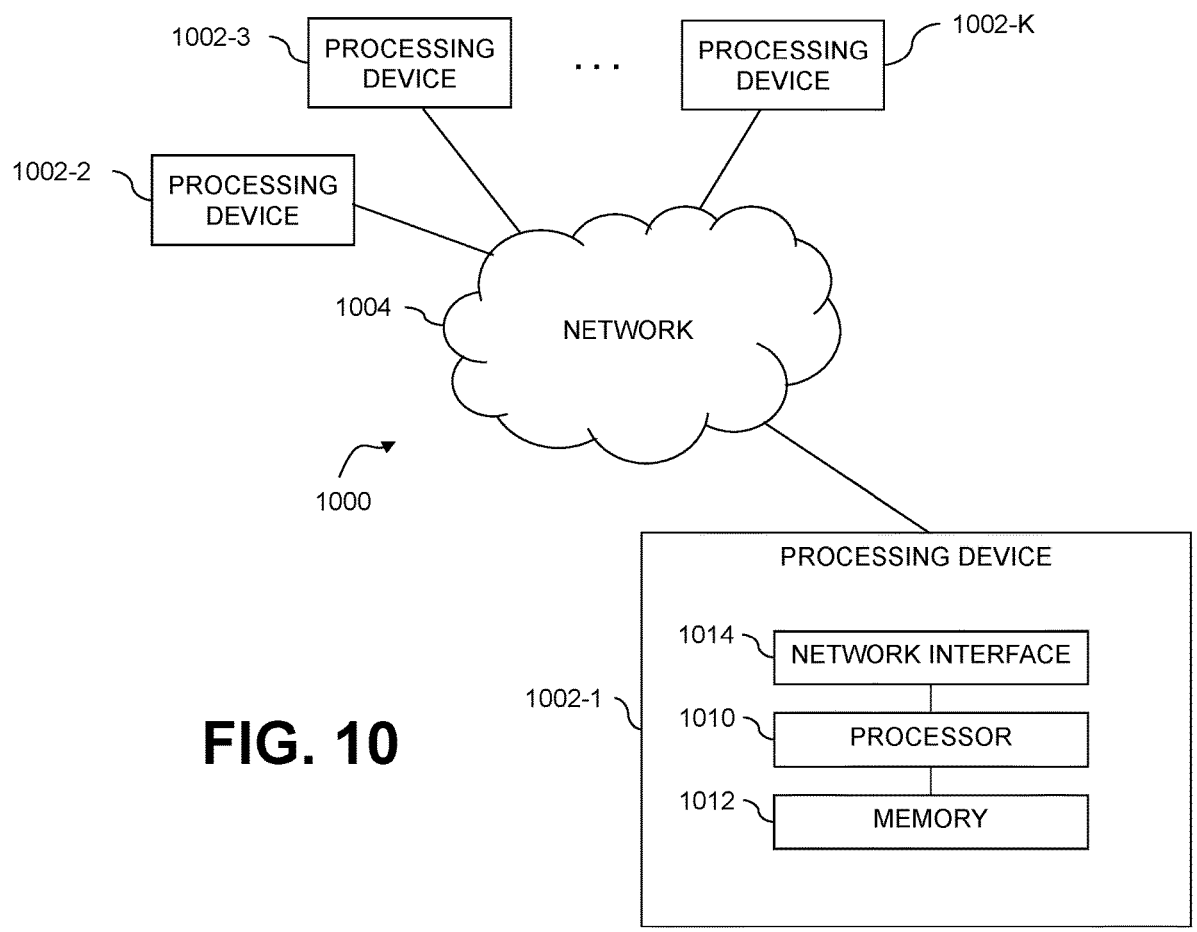

FIG. 9 shows an example processing platform comprising cloud infrastructure 900. The cloud infrastructure 900 comprises a combination of physical and virtual processing resources that may be utilized to implement at least a portion of the information processing system 100 in FIG. 1. The cloud infrastructure 900 comprises multiple virtual machines (VMs) and/or container sets 902-1, 902-2, . . . 902-L implemented using virtualization infrastructure 904.

The virtualization infrastructure 904 runs on physical infrastructure 905, and illustratively comprises one or more hypervisors and/or operating system level virtualization infrastructure. The operating system level virtualization infrastructure illustratively comprises kernel control groups of a Linux operating system or other type of operating system.

The cloud infrastructure 900 further comprises sets of applications 910-1, 910-2, . . . 910-L running on respective ones of the VMs/container sets 902-1, 902-2, . . . 902-L under the control of the virtualization infrastructure 904. The VMs/container sets 902 may comprise respective VMs, respective sets of one or more containers, or respective sets of one or more containers running in VMs.

In some implementations of the FIG. 9 embodiment, the VMs/container sets 902 comprise respective VMs implemented using virtualization infrastructure 904 that comprises at least one hypervisor. A hypervisor platform may be used to implement a hypervisor within the virtualization infrastructure 904, where the hypervisor platform has an associated virtual infrastructure management system. The underlying physical machines may comprise one or more distributed processing platforms that include one or more storage systems.

In other implementations of the FIG. 9 embodiment, the VMs/container sets 902 comprise respective containers implemented using virtualization infrastructure 904 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 900 shown in FIG. 9 may represent at least a portion of one processing platform. Another example of such a processing platform is processing platform 1000 shown in FIG. 10.

The processing platform 1000 in this embodiment comprises a portion of system 100 and includes a plurality of processing devices, denoted 1002-1, 1002-2, 1002-3, . . . 1002-K, which communicate with one another over a network 1004.

The network 1004 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1002-1 in the processing platform 1000 comprises a processor 1010 coupled to a memory 1012.

The processor 1010 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 1012 may comprise random access memory (RAM), read-only memory (ROM), flash memory or other types of memory, in any combination. The memory 1012 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1002-1 is network interface circuitry 1014, which is used to interface the processing device with the network 1004 and other system components, and may comprise conventional transceivers.

The other processing devices 1002 of the processing platform 1000 are assumed to be configured in a manner similar to that shown for processing device 1002-1 in the figure.

Again, the particular processing platform 1000 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for dynamic assignment of storage devices responsive to movement of blade servers among slots of a chassis of a modular server as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, IT assets, chassis configurations, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
   at least one processing device comprising a processor coupled to a memory;
   the at least one processing device being configured:
      to identify, for a modular server comprising a chassis with a plurality of slots, one or more blade servers installed in a first subset of the plurality of slots of the chassis and one or more storage servers installed in a second subset of the plurality of slots of the chassis;
      to determine, for the modular server, assignment of storage devices of the one or more storage servers installed in the second subset of the plurality of slots of the chassis to respective ones of the first subset of the plurality of slots of the chassis in which the one or more blade servers are installed;
      to detect movement of a given one of the one or more blade servers from a first slot to a second slot in the first subset of the plurality of slots;
      to validate a configuration of the given blade server moved from the first slot to the second slot; and
      to dynamically reassign at least a subset of the storage devices from the first slot to the second slot responsive to validating the configuration of the given blade server moved from the first slot to the second slot.

2. The apparatus of claim 1 wherein the at least one processing device comprises a chassis controller of the chassis of the modular server.

3. The apparatus of claim 1 wherein identifying the one or more blade servers installed in the first subset of the plurality of slots comprises determining a hardware configuration of each of the one or more blade servers installed in the first subset of the plurality of slots.

4. The apparatus of claim 3 wherein the determined hardware configuration for the given blade server is maintained in a trusted platform module of the at least one processing device.

5. The apparatus of claim 1 wherein determining the assignment of the storage devices of the one or more storage servers installed in the second subset of the plurality of slots of the chassis to respective ones of the first subset of the plurality of slots of the chassis in which the one or more blade servers are installed comprises generating a logical storage tree of mappings between the storage devices of the one or more storage servers and the first subset of the plurality of slots of the chassis.

6. The apparatus of claim 5 wherein the logical storage tree comprises a logical abstraction of physical storage assignment of the storage devices of the one or more storage servers to the one or more blade servers.

7. The apparatus of claim 5 wherein the logical storage tree comprises one or more controller groups and one or more storage device groups.

8. The apparatus of claim 5 wherein the logical storage tree comprises information for each of the one or more blade servers, the information for the given blade server comprising an identifier of the given blade server, a given slot number of the chassis in which the given blade server is installed, and an inventory of the storage devices assigned to the given slot number of the chassis.

9. The apparatus of claim 5 wherein dynamically reassigning at least a subset of the storage devices from the first slot to the second slot responsive to validating the configuration of the given blade server moved from the first slot to the second slot comprises identifying a storage configuration of the given blade server based at least in part on mapping an identifier of the given blade server to the logical storage tree.

10. The apparatus of claim 1 wherein validating the configuration of the given blade server comprises detecting tampering of the given blade server.

11. The apparatus of claim 1 wherein validating the configuration of the given blade server comprises determining whether any malicious software is detected on the given blade server.

12. The apparatus of claim 1 wherein validating the configuration of the given blade server comprises comparing a hardware inventory of the given blade server before and after movement of the given blade server from the first slot to the second slot.

13. The apparatus of claim 12 wherein the hardware inventory of the given blade server before movement of the given blade server from the first slot to the second slot is maintained in a trusted platform module of the at least one processing device, and wherein the hardware inventory of the given blade server after movement of the given blade server from the first slot to the second slot is determined utilizing one or more physical security algorithms of the trusted platform module.

14. The apparatus of claim 12 wherein, responsive to determining that a first hardware inventory of the given blade server before movement of the given blade server from the first slot to the second slot does not match a second hardware inventory of the given blade server after movement of the given blade server from the first slot to the second slot, the configuration of the given blade server is validated by a user proving a trusted platform module security key of the trusted platform module.

15. A computer program product comprising a non-transitory processor-readable storage medium having stored therein program code of one or more software programs, wherein the program code when executed by at least one processing device causes the at least one processing device:
    to identify, for a modular server comprising a chassis with a plurality of slots, one or more blade servers installed in a first subset of the plurality of slots of the chassis and one or more storage servers installed in a second subset of the plurality of slots of the chassis;
    to determine, for the modular server, assignment of storage devices of the one or more storage servers installed in the second subset of the plurality of slots of the chassis to respective ones of the first subset of the plurality of slots of the chassis in which the one or more blade servers are installed;
    to detect movement of a given one of the one or more blade servers from a first slot to a second slot in the first subset of the plurality of slots;
    to validate a configuration of the given blade server moved from the first slot to the second slot; and
    to dynamically reassign at least a subset of the storage devices from the first slot to the second slot responsive to validating the configuration of the given blade server moved from the first slot to the second slot.

16. The computer program product of claim 15 wherein determining the assignment of the storage devices of the one or more storage servers installed in the second subset of the plurality of slots of the chassis to respective ones of the first subset of the plurality of slots of the chassis in which the one or more blade servers are installed comprises generating a logical storage tree of mappings between the storage devices of the one or more storage servers and the first subset of the plurality of slots of the chassis.

17. The computer program product of claim 15 wherein validating the configuration of the given blade server comprises comparing a hardware inventory of the given blade server before and after movement of the given blade server from the first slot to the second slot.

18. A method comprising:
    identifying, for a modular server comprising a chassis with a plurality of slots, one or more blade servers installed in a first subset of the plurality of slots of the chassis and one or more storage servers installed in a second subset of the plurality of slots of the chassis;
    determining, for the modular server, assignment of storage devices of the one or more storage servers installed in the second subset of the plurality of slots of the chassis to respective ones of the first subset of the plurality of slots of the chassis in which the one or more blade servers are installed;
    detecting movement of a given one of the one or more blade servers from a first slot to a second slot in the first subset of the plurality of slots;
    validating a configuration of the given blade server moved from the first slot to the second slot; and
    dynamically reassigning at least a subset of the storage devices from the first slot to the second slot responsive to validating the configuration of the given blade server moved from the first slot to the second slot;
    wherein the method is performed by at least one processing device comprising a processor coupled to a memory.

19. The method of claim 18 wherein determining the assignment of the storage devices of the one or more storage servers installed in the second subset of the plurality of slots of the chassis to respective ones of the first subset of the plurality of slots of the chassis in which the one or more blade servers are installed comprises generating a logical storage tree of mappings between the storage devices of the one or more storage servers and the first subset of the plurality of slots of the chassis.

20. The method of claim 18 wherein validating the configuration of the given blade server comprises comparing a hardware inventory of the given blade server before and after movement of the given blade server from the first slot to the second slot.

* * * * *